(12) United States Patent  
Ayazi et al.

(10) Patent No.: US 7,056,757 B2  
(45) Date of Patent: Jun. 6, 2006

(54) METHODS OF FORMING OXIDE MASKS WITH SUBMICRON OPENINGS AND MICROSTRUCTURES FORMED THEREBY

(75) Inventors: Farrokh Ayazi, Atlanta, GA (US); Reza Abdolvand, Atlanta, GA (US); Siavash P. Anaraki, Smyrna, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 10/996,683

(22) Filed: Nov. 22, 2004

(65) Prior Publication Data

US 2005/0124135 A1   Jun. 9, 2005

Related U.S. Application Data

(60) Provisional application No. 60/525,390, filed on Nov. 25, 2003.

(51) Int. Cl.  
*H01L 21/00* (2006.01)

(52) U.S. Cl. .......................................... 438/48; 438/52

(58) Field of Classification Search ............ 438/48–52, 438/455–465, 33, 400–454; 216/2  
See application file for complete search history.

(56) References Cited

U.S. PATENT DOCUMENTS

| 4,449,287 A | | 5/1984 | Maas et al. ................. 156/653 |
| 4,735,681 A | | 4/1988 | Alvarez ...................... 156/652 |
| 5,573,837 A | * | 11/1996 | Roberts et al. ............. 428/210 |
| 5,595,940 A | * | 1/1997 | Trah et al. ................... 438/50 |
| 5,660,680 A | * | 8/1997 | Keller ......................... 438/50 |
| 5,721,162 A | * | 2/1998 | Schubert et al. ............. 438/52 |

(Continued)

OTHER PUBLICATIONS

S. Y. No and F. Ayazi, "The HARPSS Process for Fabrication of Nano-Precision Silicon Electromechanical Resonators". IEEE Conf. on Nanotechnology, Oct. 28-30, 2001, pp. 489-4949-494.

(Continued)

*Primary Examiner*—Savitri Mulpuri  
(74) *Attorney, Agent, or Firm*—Kenneth W. Float

(57) ABSTRACT

Processing techniques are disclosed for batch fabrication of microstructures comprising an oxide mask on a substrate with submicron openings formed therein, and microstructures having deep-submicron, high aspect-ratio etched trenches, using conventional optical photolithography. Exemplary high aspect-ratio etched-trench microstructures that may be produced include single crystal resonators and sensors.

2 Claims, 7 Drawing Sheets

U.S. PATENT DOCUMENTS

| | | | |
|---|---|---|---|
| 5,723,353 A * | 3/1998 | Muenzel et al. | 438/48 |
| 5,851,887 A | 12/1998 | Caldwell | 438/295 |
| 6,187,607 B1 * | 2/2001 | Offenberg et al. | 438/48 |
| 6,379,989 B1 * | 4/2002 | Kubby et al. | 438/52 |
| 6,399,516 B1 * | 6/2002 | Ayon | 438/739 |
| 6,461,888 B1 * | 10/2002 | Sridhar et al. | 438/52 |
| 6,909,221 B1 * | 6/2005 | Ayazi et al. | 310/321 |
| 6,913,941 B1 * | 7/2005 | O'Brien et al. | 438/48 |
| 2002/0127760 A1 * | 9/2002 | Yeh et al | 438/50 |
| 2002/0197762 A1 * | 12/2002 | Zosel et al. | 438/69 |
| 2004/0009623 A1 * | 1/2004 | Vossenberg et al. | 438/50 |
| 2004/0053435 A1 * | 3/2004 | Ikushima et al. | 438/57 |
| 2004/0065940 A1 * | 4/2004 | Ayazi et al. | 257/528 |
| 2005/0095833 A1 * | 5/2005 | Lutz et al. | 438/597 |

OTHER PUBLICATIONS

S. Pourkamali and F. Ayazi, "SOI-based HF and VHF single crystal silicon resonators with sub-100 nm vertical capacitive gaps". Transducers '03, pp. 837-840.

S. Pourkamali, et al, "High-Q Single Crystal Silicon HARPSS Capacitive Beam Resonators with Self-Aligned Sub-100nm Transduction Gaps", Journal of Micro Electro Mechanical Systems. Aug. 2003, pp. 487-496.

S. Y. No, et al. "Single crystal silicon HARPSS capacitive resonators with submicron gap spacings", proceedings, Hilton Head 2002, pp. 281-284.

K. Wang, et al, "VHF free-free beam high-Q micromechanical resonators", JMEMS, vol. 9, No. 3, Sep. 2000.

C. K. Chang, et al., "High Aspect Ratio Silicon Trench Fabrication by Inductively Coupled Plasma" published in Microsystem Technologies, vol. 6, 20000.

M. Puech, et al., "Novel Plasma Release Process and a Super High Aspect Ratio using ICP Etching for MEMS", SEMICON, Japan, Dec. 2003.

S. Pourkamali, et al., "Vertical Capacitive SiBARs", MEMS '05, Miami, 2005.

G. K. Ho, et al., "Low-Motional-Impedance Highly-Tunable 5) $I^2$ Resonators For Temperature-Compensated Reference Oscillators", MEMS '05, Miami, 2005).

Z. Hao et al., "An Analytical Model for Support Loss in Micromachined Beam Resonators with In-plane Flexural Vibrations", Sensors and Actuators A, vol. 109, Dec. 2003, p. 15656.

* cited by examiner

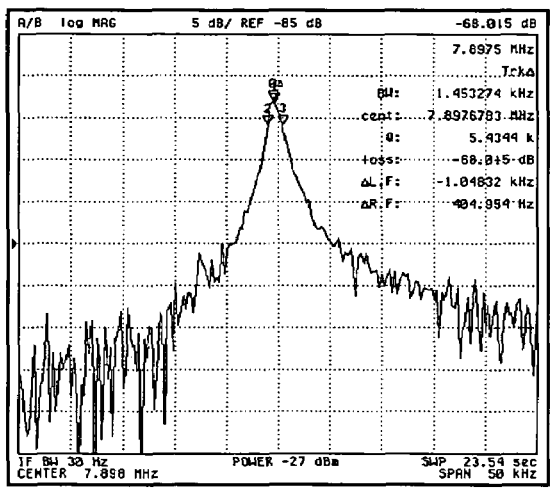
Fig. 4
Fig. 5a
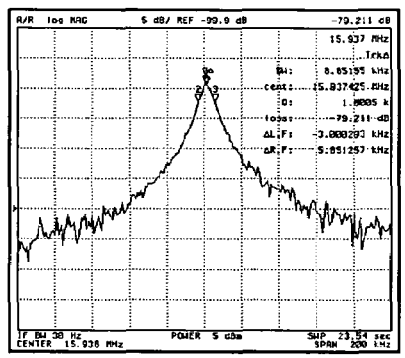
Fig. 5b
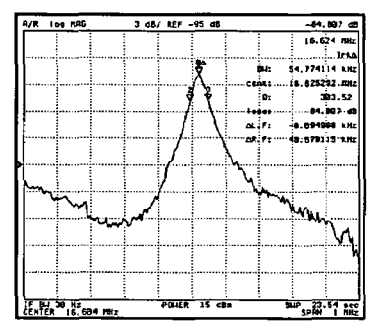
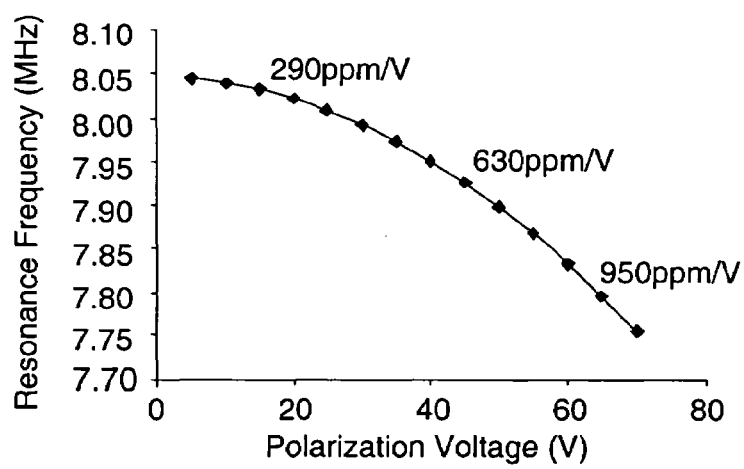
Fig. 6

METHODS OF FORMING OXIDE MASKS WITH SUBMICRON OPENINGS AND MICROSTRUCTURES FORMED THEREBY

This application claims the benefit of U.S. Provisional Application No. 60/525,390, filed Nov. 25, 2003.

GOVERNMENT RIGHTS

The U.S. Government has a paid-up license in this invention and the right in limited circumstances to require the patent owner to license others on reasonable terms as provided for by the terms of DAAH01-01-1-R004 awarded by DARPA of the U.S. Government.

BACKGROUND

The present invention relates generally to semiconductor microstructures and fabrication methods, and more particularly, to methods of forming oxide masks on substrates that have submicron openings therein and which are formed using conventional optolithography techniques, and microstructures formed using the methods, including microstructures having high aspect ratio submicron trenches formed therein.

Deep-sub-micron vertical gaps are required in certain MEMS devices to increase the capacitive electromechanical coupling. Higher coupling results in higher signal to noise ratio in sensors and lower equivalent motional impedance in electromechanical resonators.

High Q integrated micromechanical resonators are of great interest as viable substitutes for bulky and off-chip mechanical vibrating components in a variety of data processing, sensory and frequency synthesis applications. A great challenge in extending the frequency of capacitive micromechanical resonators into the RF range is maintaining acceptable impedance level and power handling capability. As the resonators are reduced in size to achieve higher frequencies, less area is available for capacitive signal transduction. In order to overcome this limitation and increase the transducer capacitance, ultra-thin inter-electrode gap spacing is required. This is discussed by S. Y. No and F. Ayazi in "The HARPSS Process for Fabrication of Nano-Precision Silicon Electromechanical Resonators". IEEE Conf. on Nanotechnology, 10/28–30/01, (2001), pp. 489–494. Therefore, low-cost manufacturing techniques that can implement high-Q capacitive resonators with scalable gap spacing in the 100 nm range are of great interest.

Papers have previously been published discussing capacitive single crystal silicon resonators with polysilicon electrodes and ultra-thin transducer gaps. See, for example, S. Pourkamali and F. Ayazi, "SOI-based HF and VHF single crystal silicon resonators with sub-100 nm vertical capacitive gaps". Transducers '03, pp. 837–840, S. Pourkamali, et al, "High-Q Single Crystal Silicon HARPSS Capacitive Beam Resonators with Self-Aligned Sub-100 nm Transduction Gaps", Journal of Micro Electro Mechanical Systems. August 2003, pp. 487–496, and S. Y. No, et al. "Single crystal silicon HARPSS capacitive resonators with submicron gap spacings", proceedings, Hilton Head 2002, pp. 281–284. The resonators were fabricated using the HARPSS process, and the transducer gaps were created by removing a thin silicon-dioxide sacrificial layer in hydrofluoric acid (HF). Surface micromachined resonators are discussed by K. Wang, et al, "VHF free-free beam high-Q micromechanical resonators", JMEMS, Vol. 9, No. 3, September 2000.

All of these previously reported processes capable of defining deep-sub-micron gaps are multi-mask fabrication sequences involving multiple deposition/etching steps. In these processes gaps are usually defined by the thickness of a sacrificial layer. As DRIE techniques improve and higher aspect ratio trenches with smaller width become achievable, dry-etching of trenches for implementation of sub-micron capacitive gaps becomes increasingly attractive. This will potentially simplify the fabrication process and enable implementation of all single crystal silicon devices. However, there are some challenges. Mask formation for dry-etching of sub-micron feature sizes is not trivial and demands for expensive state of the art optical lithography equipments. The other limiting factor is the selectivity of the etching process to the mask material. The trench depth, assuming availability of very high aspect ratio etching processes (AR>50:1), can be restricted by the mask thickness and not necessarily by the aspect ratio of the etch process.

Several US patents address submicron trenches or gaps. These include U.S. Pat. No. 4,449,287, issued May 22, 1984, entitled "Method of Providing a Narrow Groove or Slot in a Substrate Region, in Particular a Semiconductor Substrate region", U.S. Pat. No. 4,735,681, issued Apr. 5, 1988, entitled "Fabrication Method for Sub-Micron Trench", and U.S. Pat. No. 5,851,887, issued Dec. 22, 1998, entitled "Deep Sub-Micron Polysilicon Gap Formation."

SUMMARY OF THE INVENTION

Embodiments of the present invention provide for methods of processing a substrate using conventional optolithography techniques to form an oxide mask thereon that has submicron openings therein. The substrates may be further processed to produce microstructures having high aspect ratio submicron trenches formed therein.

In one exemplary method, a layer of oxide is formed on a substrate. The layer of oxide is patterned to form shallow trenches therein. A layer of sacrificial polysilicon is deposited on the patterned layer of oxide. A second layer of oxide is deposited on the patterned layer of sacrificial polysilicon. The second layer of oxide is etched back to fill the shallow trenches. The layer of sacrificial polysilicon is then etched to form submicron openings therein. This structure may be further processed by etching the substrate to form high aspect ratio trenches therein.

In another exemplary method, a layer of nitride is formed on a substrate. A polysilicon layer is deposited and patterned using a single mask. The patterned polysilicon layer is then oxidized to form a relatively thick oxide mask having submicron openings therein. This structure may be further processed by etching the layer of nitride, and etching the substrate to form high aspect ratio trenches therein.

In either case, the substrate of the further processed structure preferably comprises a first layer of substrate material, a sacrificial layer disposed on the first layer of substrate material, and a second layer of substrate material disposed on the sacrificial layer that has the high aspect ratio trenches formed therein. This structure may be further processed to etch the sacrificial layer to release the second layer of substrate material. Exemplary substrates include silicon, silicon carbide, polysilicon, gallium arsenide and other available substrates, for example.

One of the major applications the present invention is fabrication of fully single crystal silicon (SCS) capacitive resonators or sensors with deep-submicron capacitive transducer gaps (i.e., high aspect-ratio trenches) and high quality factor (Q). Using the present invention, since these structures and their electrodes can be made from single crystal silicon, much higher processing yield, reliability and long-term thermal stability can be achieved compared to resonators made using a combination of SCS and metal or polysilicon. The present invention provides for this using commercially available materials and processes. Therefore integration of high quality factor resonators and filters with existing CMOS electronics is possible.

BRIEF DESCRIPTION OF THE DRAWINGS

The various features and advantages of the present invention may be more readily understood with reference to the following detailed description taken in conjunction with the accompanying drawing figures, wherein like reference numerals designate like structural element, and in which:

FIG. 4 is a graph showing the fundamental flexural resonant mode of the beam resonator shown in FIG. 5;

FIGS. 5a and 5b are graphs illustrating the frequency response of an exemplary beam resonator measured in vacuum (left) and air (right);

FIG. 6 is a graph that illustrates electrostatic frequency tuning characteristics of the beam resonator shown in FIG. 5;

FIG. 12b shows a frequency response plot for the resonator shown in FIG. 12a;

DETAILED DESCRIPTION

The present invention provides for microstructures and fabrication methods wherein, preferably, a single mask, and conventional photolithographic techniques are used to produce the microstructures. Various types of microstructures may be produced. In its most basic form, the present invention provides for methods of processing a substrate to form an oxide mask thereon having submicron openings.

Figure 1A:
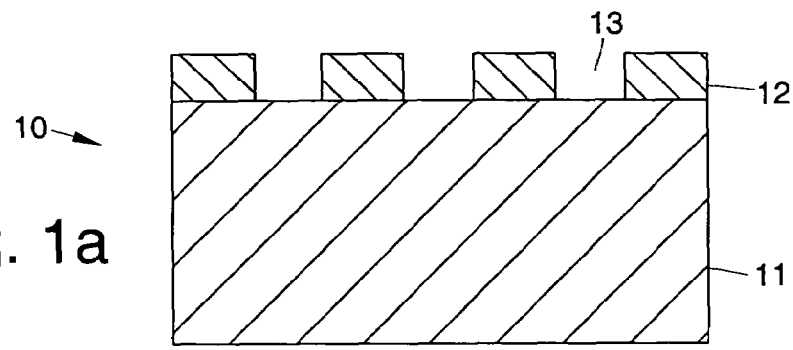
FIGS. 1a–1d illustrate processing steps of a first exemplary method in accordance with the principles of the present invention for fabricating a patterned oxide layer and self-aligned nano-trenches in a substrate.
Figure 1B:
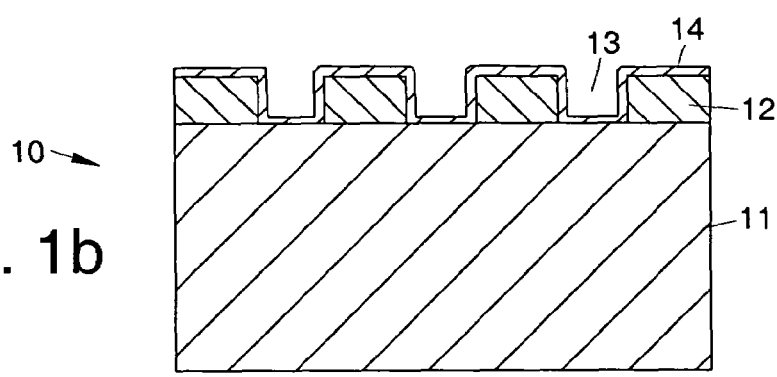
Figure 1C:
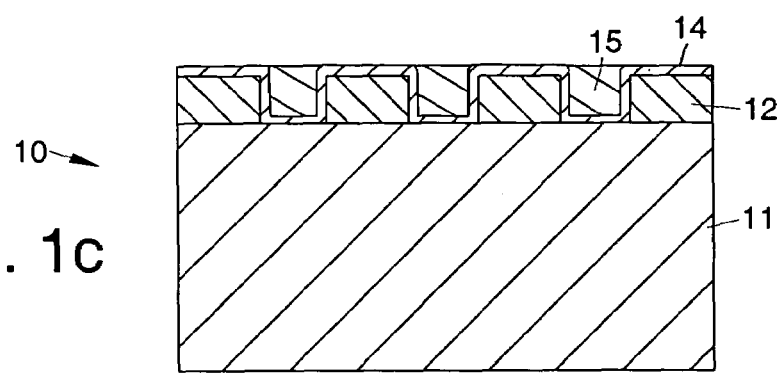

Referring to the drawing figures, FIGS. 1a–1d schematically illustrate processing steps of an exemplary method 10 in accordance with the present invention used to form submicron openings 16a in an oxide mask. In the exemplary method 10, a layer of oxide 12 is formed on a substrate 11 (FIG. 1a). The layer of oxide 12 is patterned to form shallow trenches 13 therein (FIG. 1a). A layer of sacrificial polysilicon 14 is deposited on the patterned layer of oxide 12 (FIG. 1b). A second layer of oxide 15 is deposited on the patterned layer of sacrificial polysilicon 14 and is etched back to fill the shallow trenches 13 (FIG. 1c). The layer of sacrificial polysilicon 14 is then etched to form submicron openings 16a therein (FIG. 1d) which are disposed above the top surface of the substrate 11.

The substrates may be further processed to produce microstructures having high aspect ratio submicron trenches formed therein. For example, exemplary embodiments of the present invention provide methods for fabricating fully single crystal silicon (SCS) microstructures, such as micro-mechanical resonators and sensors, for example, having deep-submicron vertical capacitive gaps and that are made using photolithographic techniques. Although specific embodiments of the present invention are described with reference to fabrication of silicon devices, it is to be understood that the present methods may be used to produce microstructures using silicon, silicon carbide, polysilicon, gallium arsenide and other available substrate materials. Thus, the present invention is not limited to silicon microstructures and fabrication processes.

The microstructures, such as the micro-resonators, may be fabricated on low resistivity silicon-on-insulator (SOI) substrates, for example, and have SCS resonating structure and transducers. The deep-submicron high aspect-ratio transducer gaps are created through a processing technique that uses low-cost micron-resolution optical lithography. The oxide mask features defining the width of the transducer gaps are created in a self-aligned manner by the thickness of a deposited sacrificial polysilicon layer, and the gaps are dry-etched, such as by using the well-known Bosch process. High aspect ratio (~20:1) trenches with width as small as 130 nm have been obtained using the Bosch process to etch the gaps. Single crystal silicon capacitive beam resonators with frequencies up to 16 MHz and transducer gaps as small as 200 nm have been successfully fabricated and characterized.

Details regarding the Bosch process may be found a paper by C. K. Chang, et al., entitled "High Aspect Ratio Silicon Trench Fabrication by Inductively Coupled Plasma" published in Microsystem Technologies, Vol. 6, 2000. The Bosch process is generally well known to those skilled in the semiconductor processing art and will not be described in detail herein.

Deep-Submicron Trench Etching

In order to implement single crystal silicon microstructures, for example, such as single crystal micro-resonators with ~100 nm capacitive gaps, the possibility of etching deep-submicron trenches in silicon using the generally well-known Bosch process was investigated. In one embodiment, the present invention is based on creating a silicon dioxide mask with deep-submicron polysilicon openings, and takes advantage of the high selectivity of the Bosch process to etch silicon dioxide (>100:1). Similar to HARPSS or surface micromachining technologies, submicron openings in the oxide mask are generated using a sacrificial layer technique. However, instead of silicon dioxide, polysilicon is used as the sacrificial layer and is removed using plasma.

Referring again to FIGS. 1a–1d schematically illustrate processing steps of an exemplary method 10 used to form self-aligned nano-trenches 16 in accordance with the present invention. As is shown in FIG. 1a, a layer of oxide 12 (oxide mask 12) (~1 μm thick) is thermally grown or deposited on a silicon substrate 11 and patterned to form shallow and narrow (~1 μm wide) oxide trenches 13 in the layer of oxide 12. As is shown in FIG. 1b, a thin layer of sacrificial low pressure chemically vapor deposited (LPCVD) polysilicon 14 (~100 nm) is then deposited on top of the layer of oxide 12.

Figure 1D:
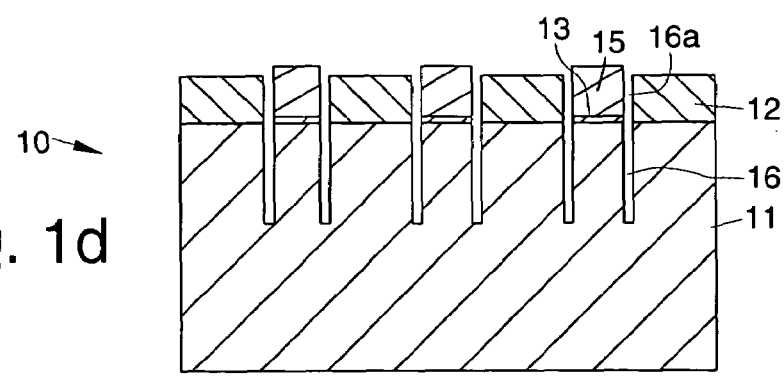

As is shown in FIG. 1c, the shallow oxide trenches 13 are subsequently refilled with LPCVD oxide 15. The deposited oxide 15 is etched back on the surface in an anisotropic plasma etchant so that polysilicon on the sidewalls of the oxide trenches 13 is exposed. As is shown in FIG. 1d, the sacrificial sidewall polysilicon 14 and the underlying silicon substrate 11 are then etched, such as by using the Bosch process, for example, in an inductively coupled plasma (ICP) system. This produces nano-trenches 16 in the silicon substrate 11. After trench etching is performed, the remaining oxide mask 12 on top of the silicon substrate 11 is removed, such as by quickly dipping or immersing the substrate in hydrofluoric acid (HF), leaving behind the nano-trenches 16 in silicon.

Figure 2A:
FIGS. 2a and 2b are cross section views of trenches etched in silicon using the method described with reference to FIGS. 1a–1d.
Figure 2B:
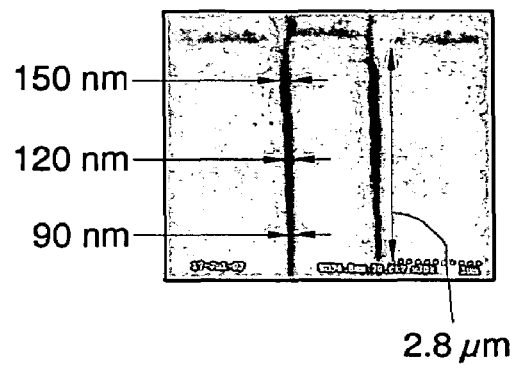

FIG. 2a shows a cross section view of ~130 nm wide, 2.6 μm deep nano-trenches 16 with an aspect ratio (AR) of 20:1 etched in silicon using the technique described with reference to FIGS. 1a–1d. The nano-trenches 16 started to pinch-off at the bottom for an aspect ratio>20:1. FIG. 2b shows exemplary dimensions of the nano-trenches 16 shown in FIG. 2a.

Resonator Fabrication

The above-described nano-trench etching method 10 was utilized to fabricate fully single crystal silicon (SCS) resonators 20 (FIG. 3) with deep-submicron capacitive transducer gaps (nano-trenches 16). The resonators 20 were batch fabricated on low resistivity SOI substrates 11 to facilitate isolation and release undercut of the structures.

The fully SCS resonators 20 were batch fabricated to produce dry-etched ultra-thin trenches 16 as the capacitive gaps. The initial oxide 12 is patterned using negative photoresist so that the resonator body and the wirebonding pads are covered by the initial oxide. Shallow trenches 13 were etched in oxide 12 at electrode locations. LPCVD sacrificial polysilicon was deposited and refilled the shallow oxide trenches 13 with silicon dioxide. Nano-trenches 16 were formed along the sidewalls of the shallow oxide trenches 13 etched in the first oxide layer 12.

In order to physically anchor drive and sense electrodes, the shallow trenches 13 were partially extended into the pad area and covered by photoresist to protect them against plasma etching. The silicon substrate 11 was patterned simultaneously during the nano-trench etching to create the body of the resonator 20 and provide electrical isolation for the electrodes. Finally, the resonators 20 were released in hydrofluoric acid (HF) and the oxide mask is removed.

Figure 3:
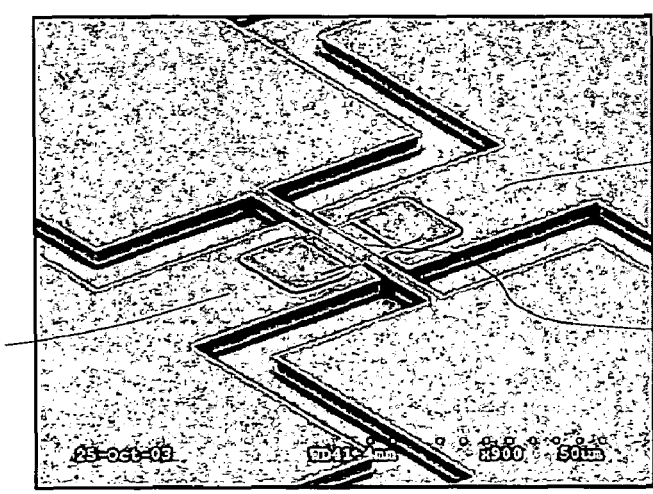
FIG. 3 shows a scanning electron microscope (SEM) view of a fabricated all single crystal silicon beam resonator fabricated using the method described with reference to FIGS. 1a–1d.

A number of beam resonators 20 with various dimensions and capacitive gap sizes were fabricated on 41 μm thick SOI substrates 11 in the above-described manner. FIG. 3 shows a scanning electron microscope (SEM) view of a fabricated 3.7 μm wide, 4 μm thick and 54 μm long all single crystal silicon (SCS) beam resonator 20 with 200 nm capacitive gaps (nano-trenches 16) showing input and output bonding pads and anchor areas.

Compared to the surface micromachined fully polysilicon resonators and HARPSS SCS resonators with polysilicon electrodes, the single crystal silicon resonators 20 fabricated using the present invention alleviate fabrication and testing problems associated with polysilicon (i.e., quality degradation caused by exposure to hydrogen fluoride (HE), and release of polysilicon debris in small gaps). In addition, having deep-submicron capacitive transducer gaps 16 makes the fabricated single crystal silicon resonators capable of operation in the VHF (30 MHz–300 MHz) and UHF (300 MHz–3 GHz) ranges (for wireless communication applications).

A number of single crystal silicon beam resonators 20 with different dimensions and 200 nm wide trenches as the capacitive transducer gaps were fabricated on a 4 μm thick silicon on insulator (SOI) substrate 11 using the present invention (resonator and electrodes are both made of single crystal silicon). SOI substrates 11 are used to allow "electrical isolation" between the body of individual single crystal silicon resonators 20 and enable perfect fabrication of "ultra-stiff" resonators 20 with height-to-width-ratio<1 (i.e., disks).

A fabricated 3.7 μm wide, 57 μm long, 4 μm thick beam resonator 20 was operated in vacuum demonstrating a quality factor of 5,300 at resonance frequency of 8.0 MHz that is the maximum achievable Q value for a beam resonator 20 of such dimensions. The electrical tuning characteristic of the beam resonator 20 was measured showing a tuning range of 228 kHz by changing the polarization voltage from 5 to 70 volts. The measured tuning range confirms a capacitive gap size of ~200 nm between the electrodes and the resonator. Resonators 20 with various shapes and dimensions and operating frequencies in the VHF and UHF with ultra-thin dry-etched trenches 16 of 100 nm and below as the transducer capacitive gaps can be fabricated using this technique. Replacement of the LPCVD polysilicon sacrificial layer with a material with lower deposition temperature (i.e., polysilicon-germanium) can provide the opportunity of low temperature post processing to integrate such devices with CMOS integrated circuits.

Measurement Results

Exemplary fabricated beam resonators 20 were tested in a two-port configuration under vacuum using a vacuum probe-station. FIG. 4 is a graph that shows the fundamental flexural resonant mode of the 3.7 μm wide. 54 μm long beam resonator 20 shown in FIG. 3. A quality factor of 5.400 was measured for this device at 7.9 MHz, which is the maximum achievable Q for a beam resonator 20 of such dimensions (limited by support loss). FIGS. 5a and 5b show graphs illustrating the frequency response of a 3.7 μm wide, 40 μm long beam resonator 20 with 350 nm capacitive gaps (nano-trenches 16), measured in vacuum (FIG. 5a) and air (FIG. 5b). The quality factor was 1,800 in vacuum and 300 in air. The lower Q of this beam resonator 20 in vacuum compared to that shown in FIG. 4 is due to its smaller aspect ratio and larger support loss.

FIG. 6 is a graph that illustrates electrostatic frequency tuning characteristics of the 8 MHz beam resonator 20 shown in FIG. 3. A tuning range of 288 kHz with tuning slope as high as 950 ppm/V has been achieved by changing the polarization voltage from 5V to 70V. According to Equation 1, the measured tuning characteristic confirms a capacitive gap size of ~200 nm between the electrodes and the resonator 20.

$$\frac{\partial f}{\partial V_p} = -\frac{2V_p f \varepsilon A_e}{Kg^3},\quad(1)$$

where $V_p$ is polarization voltage, f is frequency, $A_e$ is electrode area, K is the mechanical stiffness, g is the capacitive gap size, and $\varepsilon$ is the permittivity coefficient.

Thus, in one embodiment, batch fabrication of self-aligned deep-submicron, high aspect ratio trenches 20 and exemplary beam resonators 20 is provided. Trenches 16 as narrow as ~130 nm with aspect ratio of 20:1 were dry-etched through an optimized silicon plasma etching recipe based on the Bosch process. The nano-trench etching technique was utilized to fabricate fully single crystal silicon (SCS) capacitive high frequency resonators 20 comprised of SCS resonating structures and SCS sense and drive electrodes. Transducer capacitive gaps 16 as small as ~200 nm have been achieved for such devices. Quality factor and electrostatic tuning measurements for the fabricated beam resonators were acceptable. The fully SCS resonators 20 exhibit improved isolation and higher polarization voltage tolerance between the electrodes and the resonator body.

The present invention also provides for fabrication of microstructures, such as resonators, sensors, and other high performance capacitively-transduced Micro-Electro-Mechanical Systems (MEMS) devices with deep submicron gaps using a single-mask, conventional lithography process. This process shows great potential for manufacturing high frequency, low impedance single crystal silicon resonators on SOI substrates, for example, although the present invention is not limited to silicon or silicon-on-insulator substrates. It is believed that this embodiment of the present invention provides for the first single mask process that enables low-cost implementation of high-performance capacitive micromechanical devices with deep submicron gaps.

Figure 7A:
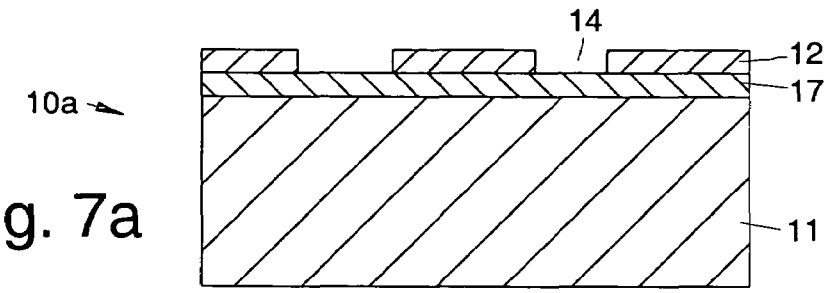
FIGS. 7a–7c schematically show processing steps of an exemplary method in accordance with the principles of the present invention used to fabricate a patterned oxide layer and nano-trenches using a single mask step.
Figure 7B:
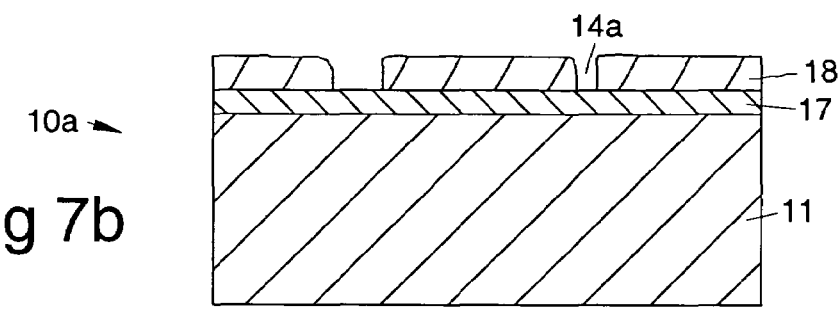

Referring to FIGS. 7a and 7b, they schematically illustrate processing steps of an exemplary method 10a in accordance with the present invention used to form submicron openings 16a in an oxide mask. In this exemplary method 10a, a layer of nitride 17 is formed on a substrate 11. A polysilicon layer 12 is deposited and patterned using a mask to have a mask pattern 14 having a plurality of openings 14 therein. The patterned polysilicon layer 12 is then oxidized to form a relatively thick oxide mask having submicron openings 14a therein.

Figure 7C:
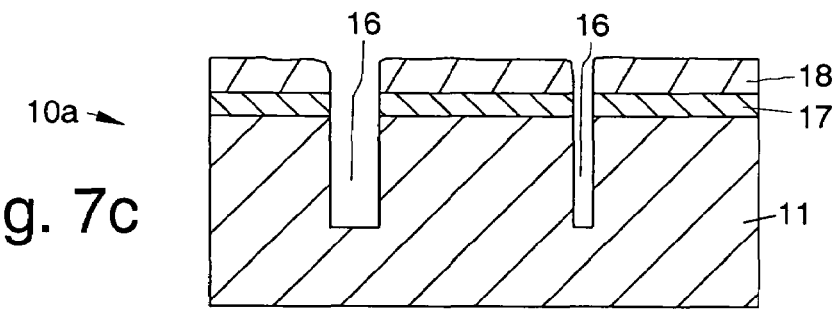

In addition, FIGS. 7a–7c schematically show processing steps of an exemplary method 10a in accordance with the principles of the present invention used to fabricate deep submicron gaps 16, or nano-trenches 16, using a single mask step.

As is shown in FIG. 7a, a layer of LPCVD nitride 12 is formed on a substrate 11, such as silicon. A thin-film layer of polysilicon 17 is formed or deposited on top of the layer of nitride 12. The layer of polysilicon 17 is patterned using a mask and conventional optical photolithographic techniques to produce a desired mask pattern 14 comprising openings 14 defining trenches.

As is shown in FIG. 7b, the patterned layer of polysilicon 17 is oxidized to produce an oxide layer 18 so that the openings 14a are reduced in size by a predetermined amount for each opening 14a. Thus, this method 10a provides for openings 14 or gaps 14 that have different widths.

As is shown in FIG. 7c, the layer of nitride 17 and the substrate 11 are then etched through the oxide layer 18 to form the nano-trenches 16. Again, note that the illustrated nano-trenches 16 have different widths, which are a function of the initial size of the openings 14 and that fact that the oxidized layer of polysilicon 17 grows by a controllable amount to produce the desired opening sizes. Submicron trenches 16 (120 nm wide) with aspect ratios greater than 20:1 have been demonstrated using 1 micron mask features. Higher aspect ratios and smaller gap sizes (<150 nm) are obtainable.

Figure 8A:
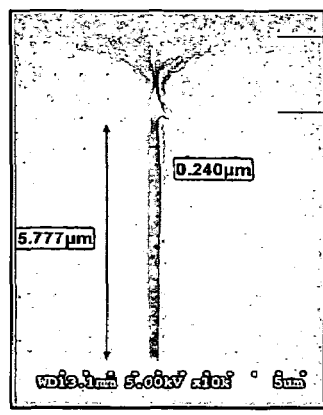
FIG. 8a shows a scanning electron microscope (SEM) view of A 240 nm wide trench etched in silicon using the method described with reference to FIGS. 7a–7c.

FIG. 8a shows a scanning electron microscope (SEM) view of 240 nm wide trench etched in silicon using the method described with reference to FIGS. 7a–7c.

Figure 8B:
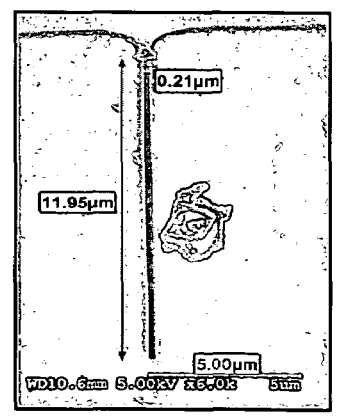
FIG. 8b shows a scanning electron microscope (SEM) view of 12.3 μm deep, 210 nm wide trench etched in silicon using the method described with reference to FIGS. 7a–7c.

FIG. 8b shows a scanning electron microscope (SEM) view of 12.3 µm deep, 210 nm wide trench etched in silicon using the method described with reference to FIGS. 7a–7c. This trench was produced using an AMS 200 DRIE machine manufactured by Alcatel, and depassivation using the so called SHARP (Super High Aspect Ratio Process) process described by M. Puech, et al., in "A Novel Plasma Release Process and a Super High Aspect Ratio using ICP Etching for MEMS", SEMICON, Japan, December 2003. The trench shown in FIG. 8b is believed to be the highest aspect ratio (~60:1) 200 nm dry etched gap that has been produced to date.

FIGS. 9a–9e schematically illustrate the detailed process flow of an exemplary method 10a of fabricating a microstructure 20 in accordance with the principles of the present invention.

Figure 9A:
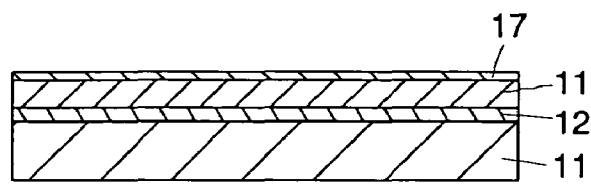
FIGS. 9a–9e schematically illustrate process steps of an exemplary method in accordance with the present invention used to fabricate microstructures having deep submicron gaps.

Referring to FIG. 9a, an SOI wafer comprising a first silicon layer 11, an oxide layer 12 and a second silicon layer 11 is provided. A thin layer of LPCVD nitride 17 is deposited on the SOI wafer and which prevents oxidation of the second silicon layer 11 in subsequent process steps.

Figure 9B:
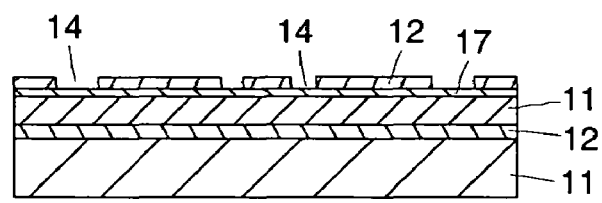

Referring to FIG. 9b, a thin-film polysilicon layer 12 is deposited and patterned to produce openings 14 using a single mask. This mask defines the areas (openings 14) that will etched away to create final device structure. The minimum feature size on this pattern is determined by the lithography (>1 µm typically).

Figure 9C:
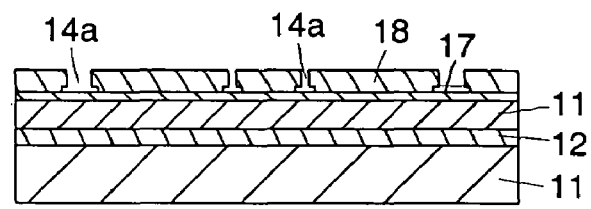

Referring to FIG. 9c, the patterned polysilicon layer 12 is oxidized in an oxidation furnace to form an oxide mask 18 (for a subsequent DRIE step). All openings 14a are reduced in size due to a ~2× enlargement of oxidized polysilicon.

Figure 9D:
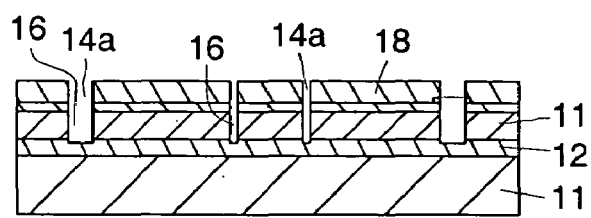

Referring to FIG. 9d, an anisotropic dry etching of the thin nitride layer 17 is performed in an inductively coupled plasma (ICP) system. Then, a low pressure, high power, highly anisotropic deep reactive ion etching (DRIE) recipe is used to etch the second silicon layer 11 down to the oxide layer 12.

Figure 9E:
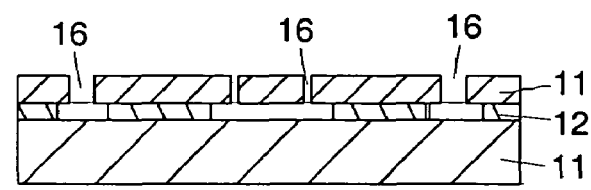

Referring to FIG. 9e, a wet oxide etch is performed to remove all the oxide on top and underneath the microstructure 20. The final step involves maskless etching of the nitride layer 7 back to the single crystal silicon layer 11 in a reactive ion etching (RIE) system.

To evaluate the performance of the reduced-gap single mask method 10a, electromechanical resonators 20 were fabricated and tested. Various resonators 20 with different structural designs were drawn on the mask to cover a broad range of frequency and quality factor.

Figure 10:
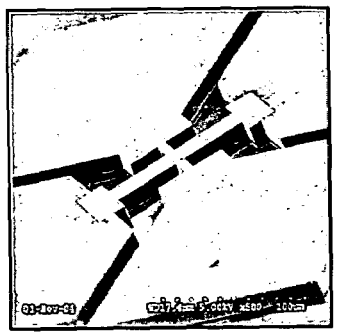
FIG. 10 shows a scanning electron microscope (SEM) view of an exemplary beam resonator fabricated using the method described with reference to FIGS. 9a–9e.

FIG. 10 shows a scanning electron microscope (SEM) view of an exemplary beam resonator 20 fabricated using the method described with reference to FIGS. 11a–11e.

More particularly, FIG. 10 shows a 50 μm long, 6 μm wide and 10 μm thick beam resonator 20 fabricated using the present method 10a.

Figure 11:
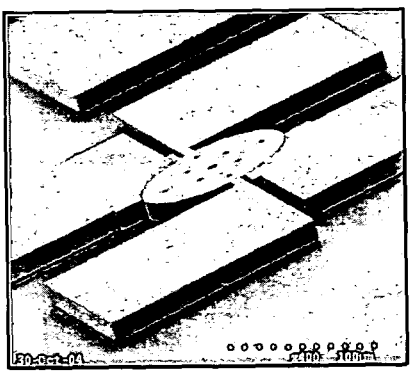
FIG. 11 shows a scanning electron microscope (SEM) view of an exemplary side-supported disk resonator fabricated using the method described with reference to FIGS. 9a–9e.

FIG. 11 shows a scanning electron microscope (SEM) view of an exemplary side-supported disk resonator 20 fabricated using the method described with reference to FIGS. 9a–9e. More particularly, FIG. 11 shows a 100 μm diameter side-supported disk resonator 20 on a 10 μm thick SOI wafer fabricated using the present method 10a.

Unlike the processes that create small gaps by removal of sacrificial oxide layer, the hydrofluoric acid (HF) release step in present method 10a is short (enough to remove the oxide beneath the movable structure). For very wide structures, some release holes were considered in the resonator body to reduce excessive HF release time (FIG. 11). Measurement results presented in the following section showed very minor effect on frequency caused by introducing the release holes in the bulk mode resonator 20. Little or no scalloping was introduced in the DRIE etch step.

Frequency response of fabricated resonators 20 with different structures were measured using a network analyzer in a two-port configuration.

Figure 12A:
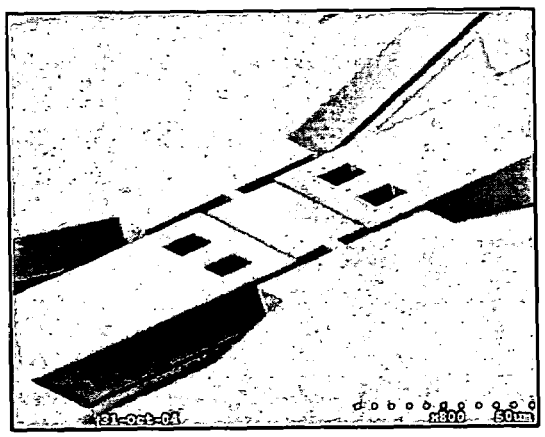
FIG. 12a shows a scanning electron microscope (SEM) view of an exemplary SiBAR resonator.
Figure 12B:
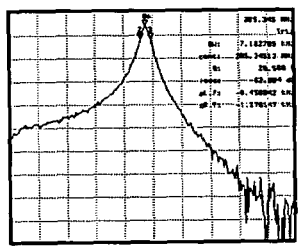

FIG. 12a shows a scanning electron microscope (SEM) view of an exemplary SiBAR resonator. More particularly, FIG. 12a shows a 20 μm wide, 80 μm long SiBAR resonator 20 fabricated using the present method 10a. The SiBAR resonator is discussed by S. Pourkamali, et al., "Vertical Capacitive SiBARs", MEMS '05, Miami, 2005. FIG. 12b shows a frequency response plot for the resonator shown in FIG. 12a.

The highest recorded resonant frequency was 205 MHz measured for a 20 μm wide, 10 μm SiBAR resonator (FIG. 12a). Comparing the measured motional impedance of this device at 50V polarization voltage with the one presented in Pourkamali, et al. paper, an effective capacitive gap size of ~260 nm is extracted.

Figure 13:
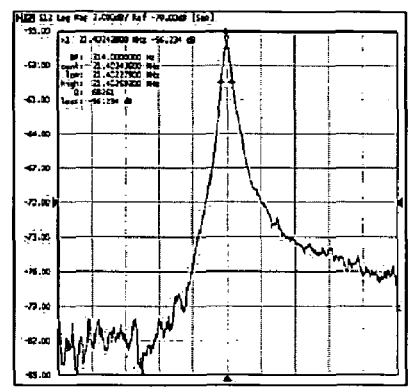
FIG. 13 shows a resonant peak measured from an exemplary beam resonator.

The highest quality factor was measured to be ~68,000 at resonant frequency of 21.4 MHz for the 140 μm long beam resonator 20 (FIG. 10) in vacuum. The two extended areas on either ends (resembling an I-beam shape) of this resonator 20 are designed to provide more transduction capacitance and reduce the motional impedance of the resonating structure (see G. K. Ho, et al., "Low-Motional-Impedance Highly-Tunable I$^2$ Resonators For Temperature-Compensated Reference Oscillators", MEMS '05, Miami, 2005). FIG. 13 shows a resonant peak measured from a 140 long I-beam resonator 20. The resonant frequency is ~21.4 MHz, but quality factor of the a resonator 20 having with a wider support beam is more than 3 times lower than one with a narrower support beam (not shown). This observation confirms that the measured quality factor for these structures is mainly limited by support loss.

Figure 14:
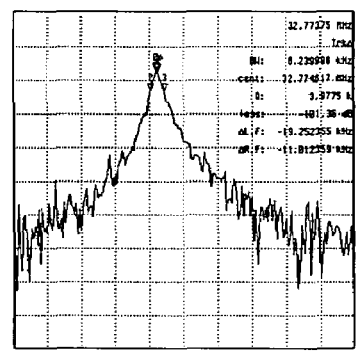
FIG. 14 shows measured quality factors for the beam resonator shown in FIG. 10.
Figure 15:
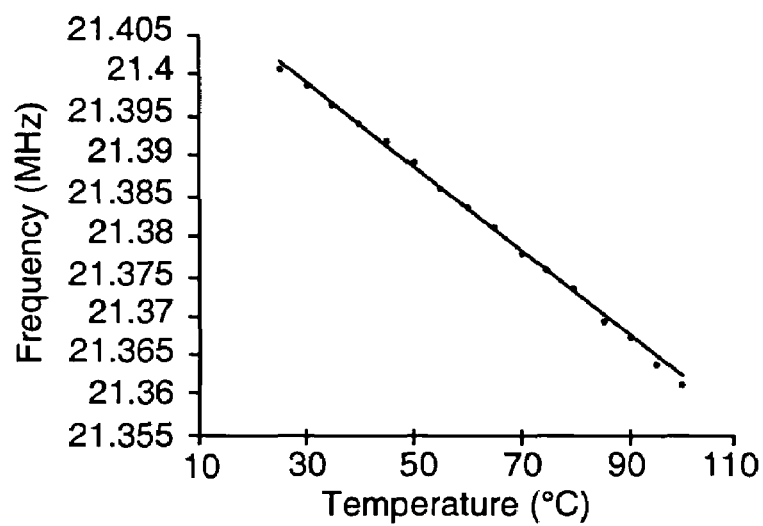
FIG. 15 shows a frequency versus temperature plot for the beam resonator shown in FIG. 10.

Measured quality factors of FIG. 14 for the beam resonator 20 of FIG. 10 and side-supported disk resonator 20 of FIG. 11 were also confirmed to be limited by support loss when compared with the estimated Q-support values obtained through expressions discussed by Z. Hao et al., "An Analytical Model for Support Loss in Micromachined Beam Resonators with In-plane Flexural Vibrations", Sensors and Actuators A, Vol. 109, December 2003, p. 156, for example. FIG. 15 shows a frequency versus temperature plot for the beam resonator 20 shown in FIG. 10. The TCF value extracted from this plot is ~-24.8 ppm/° C.

Thus, the second method embodiment of the present invention provides for batch fabrication of all single crystal microstructures, such as silicon capacitive resonators or sensor, for example, in which the ultra-thin high aspect-ratio transducer gaps are dry-etched in the device layer of an SOI substrate. A dry etching process (the Bosch process, for example) has been used to dry etch 130 nm wide, 2.6 μm deep trenches (aspect ratio of 20:1) in silicon, which is believed to be the first deep-submicron-wide trench etching achieved using the Bosch process.

The 100 nm mask features required for the trench etching step are created with a batch processing technique that uses regular micron-resolution optical lithographic tools. In contrast to other capacitive silicon resonators, such as those discussed in the V. Kaajakari et al, "Square-extentional mode single crystal silicon micromechanical RF-resonator" paper mentioned in the Background section, the present invention fabricates in-batch, sub-100 nm dry-etched transducer gaps in silicon using low-cost optical lithography.

The all single crystal silicon capacitive resonators disclosed herein alleviate the fabrication and testing problems associated with using polysilicon. i.e., quality degradation caused by exposure to hydrofluoric acid (HF), and release of polysilicon debris in small capacitive gaps. In addition, the present invention provides for superior electrical isolation for the input and output ports and higher polarization voltage tolerance between the electrodes and the resonator.

Thus, a simple cost-effective single-mask method 10a for fabricating thick oxide masks with deep-submicron openings is provided by the present invention. Various etching recipes were implemented to fabricate fully single crystal silicon resonating structures with narrow dry-etched capacitive transduction gaps.

Thus, batch fabrication processes for producing oxide layers having submicron openings, deep-submicron dry-etched trenches, and microstructures having such openings and trenches have been disclosed. It is to be understood that the above-described embodiments are merely illustrative of some of the many specific embodiments that represent applications of the principles of the present invention. Clearly, numerous and other arrangements can be readily devised by those skilled in the art without departing from the scope of the invention.

What is claimed is:

1. A method of processing a substrate to form a movable microstructure, comprising:
    forming a layer of oxide on a substrate;
    patterning the layer of oxide to form shallow trenches therein;
    depositing a layer of sacrificial polysilicon on the patterned layer of oxide;
    depositing a second layer of oxide on the patterned layer of sacrificial polysilicon to fill the shallow trenches;
    etching back the second layer of oxide to expose the sacrificial polysilicon;
    etching the layer of sacrificial polysilicon to form submicron openings therein, and
    etching the substrate to form high aspect ratio trenches to form movable microstructure by undercutting.

2. The method recited in claim 1 wherein the substrate is a semiconductor on insulator substrate and comprises:
    a first layer of substrate material;
    an insulating sacrificial layer disposed on the first layer of substrate material;
    a second layer of substrate material disposed on the insulating sacrificial layer that has the high aspect ratio trenches formed therein; and
    etching the insulating sacrificial layer to release the movable microstructure formed in the second layer of the material.

* * * * *

UNITED STATES PATENT AND TRADEMARK OFFICE
CERTIFICATE OF CORRECTION

| | | |
|---|---|---|
| PATENT NO. | : 7,056,757 B2 | Page 1 of 1 |
| APPLICATION NO. | : 10/996683 | |
| DATED | : June 6, 2006 | |
| INVENTOR(S) | : Farrokh Ayazi et al. | |

It is certified that error appears in the above-identified patent and that said Letters Patent is hereby corrected as shown below:

Col 1
Please delete the paragraph in the Government Rights section and substitute the following paragraph:

This invention was made with Government support under Contract No. DAAH01-01-1-R004 awarded by the US Army Aviation and Missile Command. The Government has certain rights in the invention.

Signed and Sealed this

Twenty-sixth Day of February, 2008

JON W. DUDAS
*Director of the United States Patent and Trademark Office*